US011869795B2

(12) United States Patent
Pemmasani et al.

(10) Patent No.: US 11,869,795 B2
(45) Date of Patent: Jan. 9, 2024

(54) MESA HEIGHT MODULATION FOR THICKNESS CORRECTION

(71) Applicant: Applied Materials, Inc., Santa Clara, CA (US)

(72) Inventors: Saketh Pemmasani, Hyderabad (IN); Akshay Dhanakshirur, Hubli (IN); Mayur Govind Kulkarni, Bangalore (IN); Madhu Santosh Kumar Mutyala, Santa Clara, CA (US); Hang Yu, San Jose, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 123 days.

(21) Appl. No.: 17/371,549

(22) Filed: Jul. 9, 2021

(65) Prior Publication Data
US 2023/0008922 A1    Jan. 12, 2023

(51) Int. Cl.
*H01L 21/683* (2006.01)
*C23C 16/458* (2006.01)
*H01J 37/32* (2006.01)

(52) U.S. Cl.
CPC ...... *H01L 21/6833* (2013.01); *C23C 16/4586* (2013.01); *H01J 37/32697* (2013.01); *H01J 37/32724* (2013.01); *H01J 2237/3321* (2013.01)

(58) Field of Classification Search
CPC ............ H01L 21/6833; C23C 16/4586
See application file for complete search history.

(56) References Cited

U.S. PATENT DOCUMENTS

| 5,547,539 A | * | 8/1996 | Arasawa | ............... C23C 16/466 438/715 |
| 6,494,955 B1 | | 12/2002 | Lei et al. | |
| 6,709,267 B1 | * | 3/2004 | Hawkins | ............. C23C 16/4585 414/935 |
| 2014/0251542 A1 | | 9/2014 | Parsey et al. | |
| 2016/0035610 A1 | * | 2/2016 | Park | .................... H01L 21/6833 165/80.2 |

FOREIGN PATENT DOCUMENTS

| JP | 11330219 A | 11/1999 |
| KR | 20160015510 A | 2/2016 |
| TW | 202123378 A | 6/2021 |
| WO | 2015165653 A1 | 11/2015 |

OTHER PUBLICATIONS

International Search Report and Written Opinion dated Nov. 1, 2022 in International Patent Application No. PCT/US2022/035914, 11 pages.

* cited by examiner

*Primary Examiner* — Scott Bauer
(74) *Attorney, Agent, or Firm* — Kilpatrick Townsend & Stockton LLP (57) ABSTRACT

Exemplary substrate support assemblies may include a chuck body defining a substrate support surface. The substrate support surface may define a plurality of protrusions that extend upward from the substrate support surface. The substrate support surface may define an annular groove and/or ridge. A subset of the plurality of protrusions may be disposed within the annular groove and/or ridge. The substrate support assemblies may include a support stem coupled with the chuck body.

17 Claims, 5 Drawing Sheets

MESA HEIGHT MODULATION FOR THICKNESS CORRECTION

TECHNICAL FIELD

The present technology relates to components and apparatuses for semiconductor manufacturing. More specifically, the present technology relates to processing chamber heating components and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

BRIEF SUMMARY OF THE INVENTION

Exemplary substrate support assemblies may include a chuck body defining a substrate support surface. The substrate support surface may define a plurality of protrusions that extend upward from the substrate support surface. The substrate support surface may define an annular groove. A subset of the plurality of protrusions may be disposed within the annular groove. The substrate support assemblies may include a support stem coupled with the chuck body.

In some embodiments, each protrusion within the subset may have a greater height than each of the plurality of protrusions that are not disposed within the annular groove. A top surface of each of the plurality of protrusions may be at a substantially same vertical position. The annular groove may be disposed within an outer 50% of a radius of the substrate support surface. The substrate support surface may define an additional annular groove. The annular groove and the additional annular groove may be spaced apart from one another. The annular groove and the additional annular groove may be in contact with one another. A depth of the annular groove may be constant across a width of the annular groove. A depth of the annular groove may vary across a width of the annular groove.

Some embodiments of the present technology may encompass substrate support assemblies. The substrate support assemblies may include a chuck body defining a substrate support surface. The substrate support surface may define a plurality of protrusions that extend upward from the substrate support surface. The substrate support surface may define one or more regions that are depressed relative to a primary region of the substrate support surface. A subset of the plurality of protrusions may be disposed within the one or more regions. The substrate support assemblies may include a support stem coupled with the chuck body.

In some embodiments, each protrusion within the subset may have a height of at least 1.2 mils and each of the plurality of protrusions that are not disposed within the one or more regions may have a height of less than about 1.2 mils. The one or more regions may include a first region and a second region. The first region may have a different depth than the second region. A top surface of each of the plurality of protrusions may be at a substantially same vertical position. A distance between the substrate support surface and the top surface of each of the plurality of protrusions may vary across a width of the substrate support surface. A density of the plurality of protrusions may be greater near a peripheral edge of the substrate support surface than near a center of the substrate support surface. The chuck body may include an electrostatic chuck or a vacuum chuck. At least one of the one or more regions may include an annular groove. At least one of the one or more regions may extend only partially about a circumference of the substrate support surface.

Some embodiments of the present technology may encompass methods of processing a substrate. The methods may include clamping a substrate to a substrate support surface of a chuck body using a chucking force. The substrate support surface may define a plurality of protrusions that extend upward from the substrate support surface. The substrate support surface may define one or more regions that are depressed relative to a primary region of the substrate support surface. A subset of the plurality of protrusions may be disposed within the one or more regions. The methods may include flowing a precursor into a processing chamber. The methods may include generating a plasma of the precursor within a processing region of the processing chamber. The methods may include depositing a material on the substrate.

In some embodiments, the chucking force may include an electrostatic chucking force. At least one of the one or more regions may include an annular groove.

Such technology may provide numerous benefits over conventional systems and techniques. For example, embodiments of the present technology may allow controlled deposition at various radial positions of a substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce residual non-uniformity across a substrate. Temperature differences, flow pattern uniformity, and other aspects of processing may impact the films on the substrate, creating film uniformity differences across the substrate for materials produced or removed. For example, turbulent deposition gas flow and/or misalignment of apertures of a blocker plate and faceplate of a gas box may lead to non-uniform flow of deposition gases. Additionally, due to discontinuities near the wafer edge (such as a gap between the wafer edge and a heater pocket), gas flow across the wafer may be non-uniform, which may lead to non-uniform film deposition. In some instances, the blocker plate may not uniformly distribute flow of precursors to edge regions of a substrate. Additionally, in some embodiments a substrate support or heater on which a substrate is disposed may include one or more heating mechanisms to heat a substrate. When heat is delivered or lost differently between regions of a substrate, the film deposition may be impacted where, for example, warmer portions of the substrate may be characterized by thicker deposition or different film properties relative to cooler portions. This temperature non-uniformity may be attributable, for example, to temperature fluctuations about the shaft of the pedestal and may particularly affect edge regions of substrates.

The present technology overcomes these challenges by incorporating a heater that includes one or more depressed regions, such as annular grooves. The grooves may increase a size of a gap formed between the bottom surface of the substrate and the top surface of the substrate support surface, which may provide more space for gas to accumulate. This gap (and the gas trapped therein) may enable the heater to better absorb heat generated by the plasma, which may result in lower temperatures at areas of the substrate proximate the larger gaps. The lower temperatures may reduce the deposition rate of plasma in these areas of the substrate. Such substrate support surfaces may often be used to combat radial non-uniformity issues.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

Figure 1:
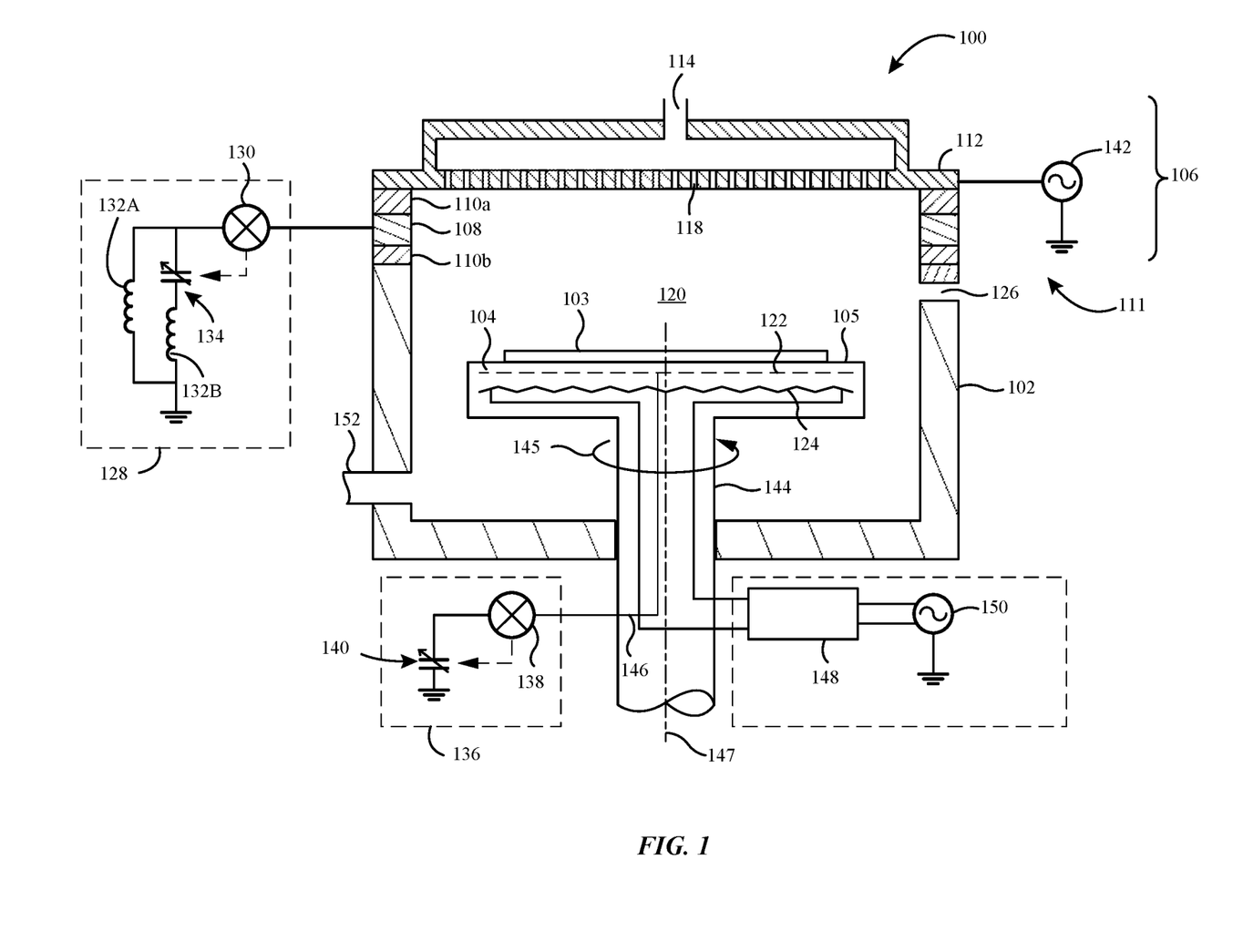
FIG. 1 shows a schematic cross-sectional view of an exemplary plasma system according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as a radio frequency (RF) generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2A:
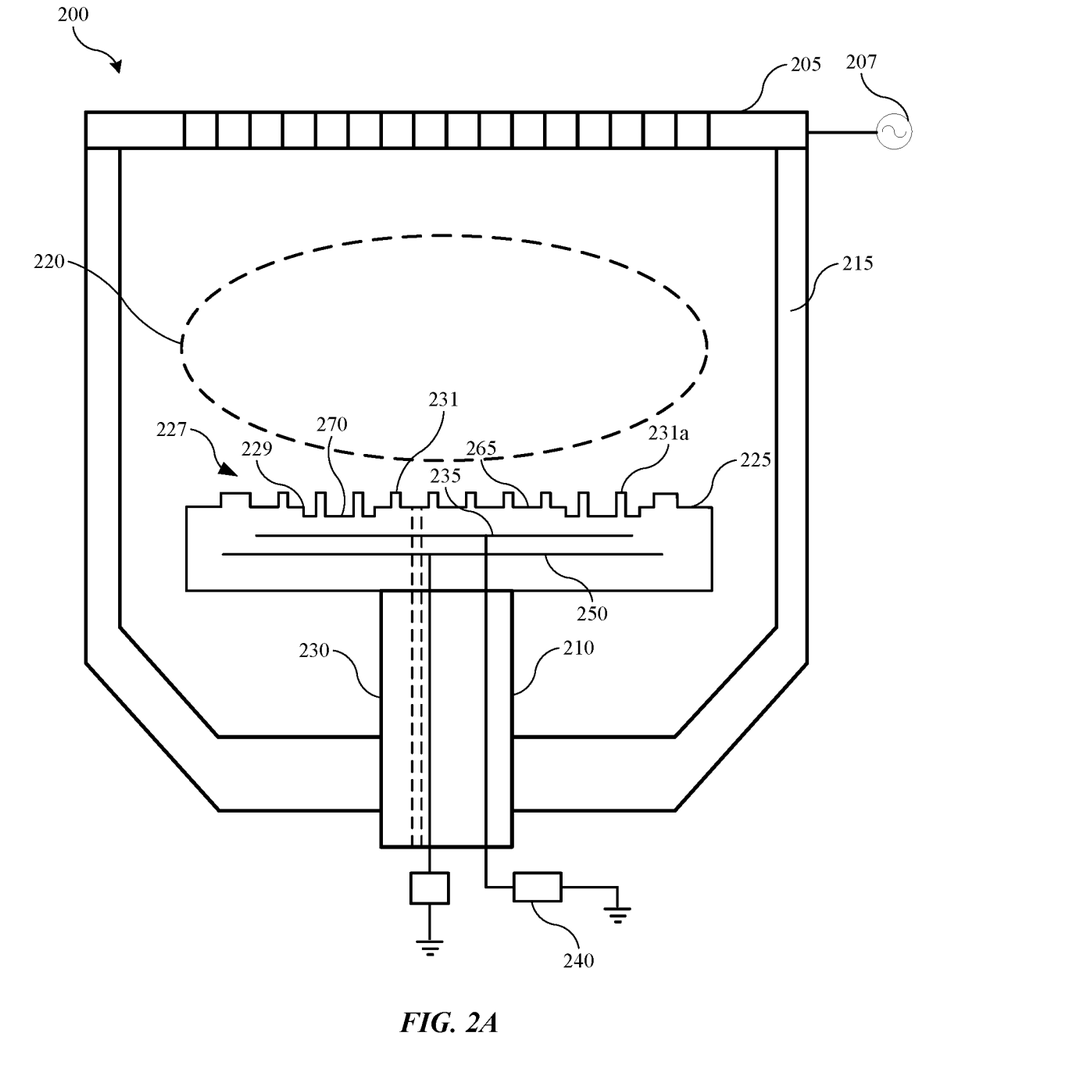
FIG. 2A shows a schematic cross-sectional view of an exemplary plasma system according to some embodiments of the present technology.
Figure 2B:
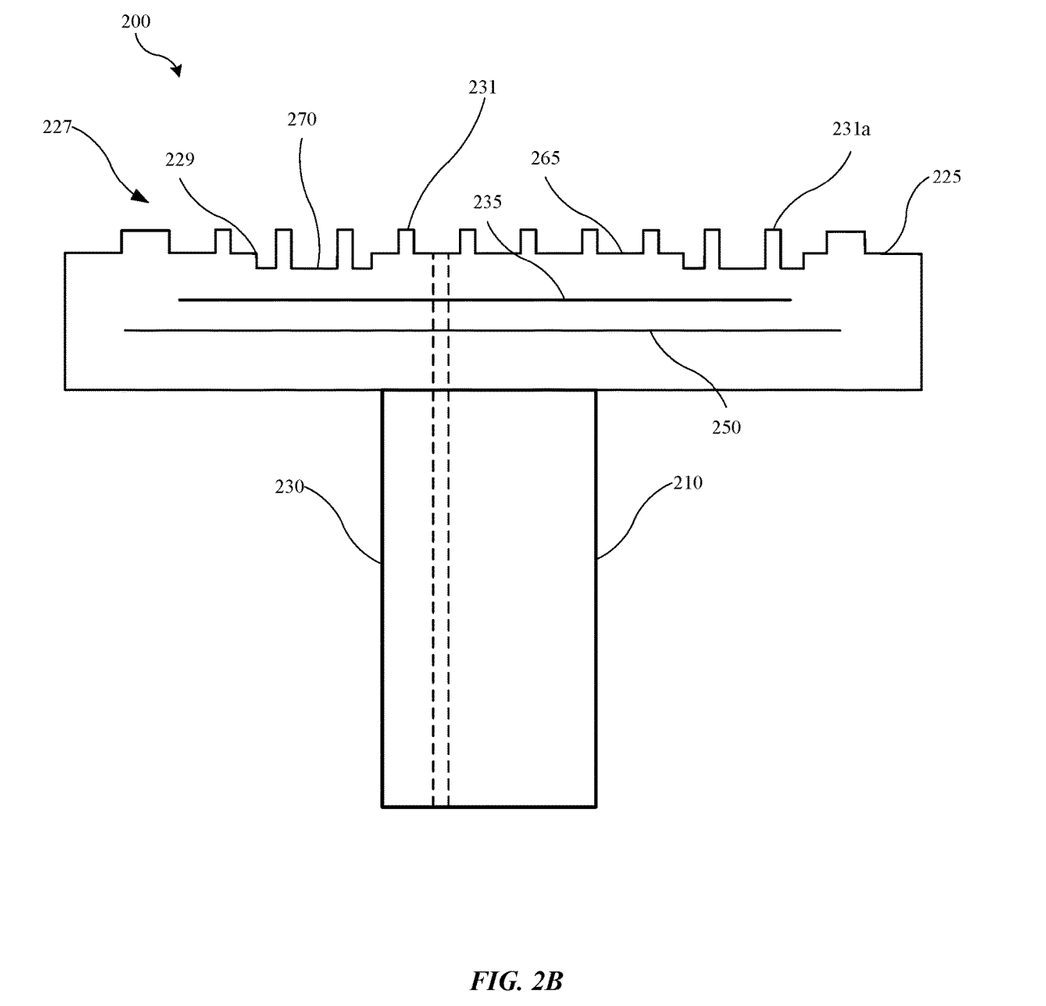
FIG. 2B shows a schematic cross-sectional view of the substrate support of FIG. 2A.
Figure 2C:
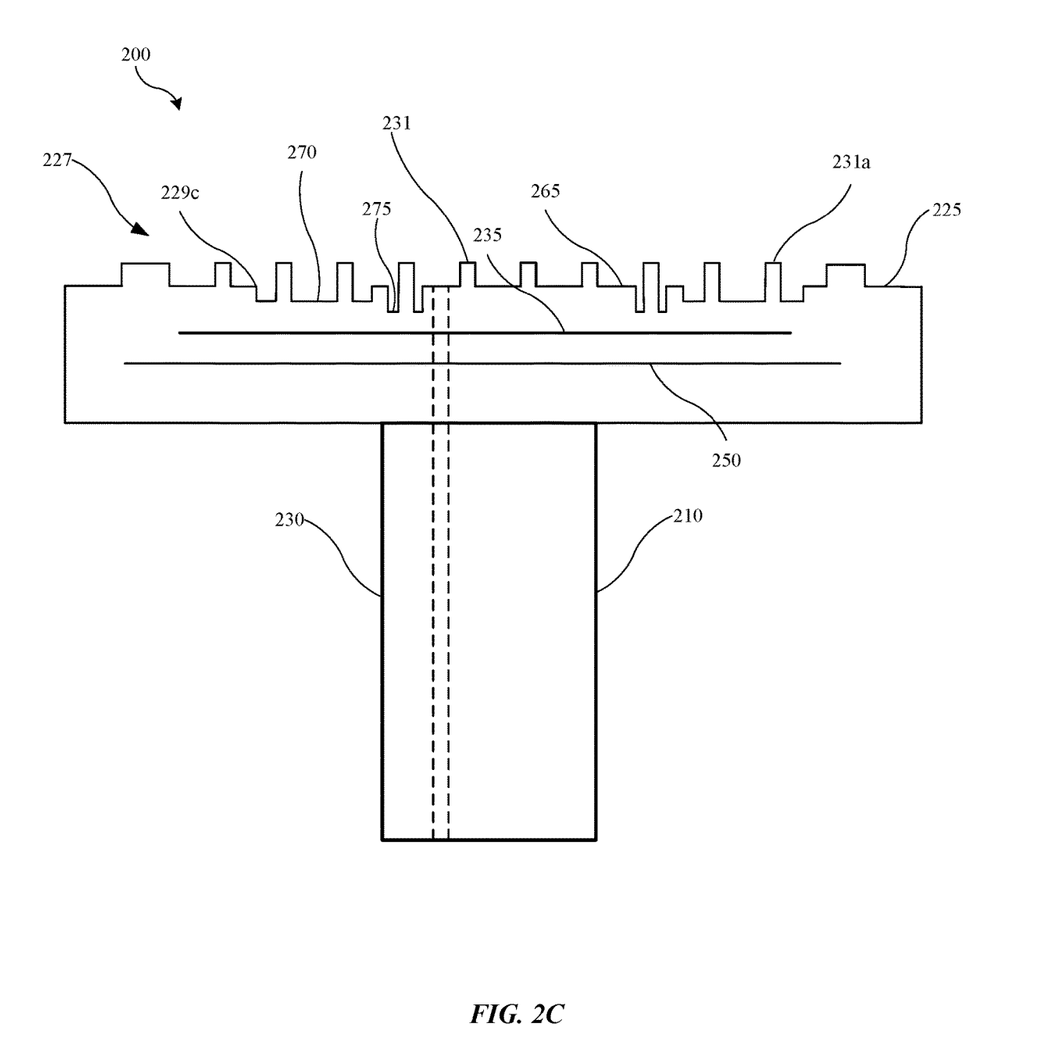
FIG. 2C shows a schematic cross-sectional view of an exemplary plasma system according to some embodiments of the present technology.

FIGS. 2A-2C show a schematic partial cross-sectional view of an exemplary semiconductor processing chamber 200 according to some embodiments of the present technology. FIGS. 2A-2C may include one or more components discussed above with regard to FIG. 1, and may illustrate further details relating to that chamber. The chamber 200 may be used to perform semiconductor processing operations including deposition of stacks of dielectric materials as previously described. Chamber 200 may show a partial view of a processing region of a semiconductor processing system, and may not include all of the components, such as additional lid stack components previously described, which are understood to be incorporated in some embodiments of chamber 200.

As noted, FIGS. 2A-2C may illustrate a portion of a processing chamber 200. The chamber 200 may include a showerhead 205, as well as a substrate support assembly 210. Along with chamber sidewalls 215, the showerhead 205 and the substrate support 210 may define a substrate processing region 220 in which plasma may be generated. The substrate support assembly may include an electrostatic chuck body 225, which may include one or more components embedded or disposed within the body. The components incorporated within the top puck may not be exposed to processing materials in some embodiments, and may be fully retained within the chuck body 225. Electrostatic chuck body 225 may define a substrate platform 227 having an substrate support surface 229, and may be characterized by a thickness and length or diameter depending on the specific geometry of the chuck body 225. In some embodiments, the substrate support surface 229 may be recessed relative to a top surface of the substrate platform 227. In some embodiments the chuck body may be elliptical, and may be characterized by one or more radial dimensions from a central axis through the chuck body 225. It is to be understood that the top puck may be any geometry, and when radial dimensions are discussed, they may define any length from a central position of the chuck body 225.

Electrostatic chuck body 225 may be coupled with a stem 230, which may support the chuck body 225 and may include channels as will be discussed below for delivering and receiving electrical and/or fluid lines that may couple with internal components of the chuck body 225. Chuck body 225 may include associated channels or components to operate as an electrostatic chuck, although in some embodiments the assembly may operate as or include components for a vacuum chuck, or any other type of chucking system. Stem 230 may be coupled with the chuck body on a second surface of the chuck body opposite the substrate support surface. The electrostatic chuck body 225 may include an electrode 235, which may be a DC electrode, embedded within the chuck body proximate the substrate support surface. Electrode 235 may be electrically coupled with a power source 240. Power source 240 may be configured to provide energy or voltage to the electrically conductive chuck electrode 235. This may be operated to form a plasma of a precursor within the processing region 220 of the semiconductor processing chamber 200, although other plasma operations may similarly be sustained. For example, electrode 235 may also be a chucking mesh that operates as electrical ground for a capacitive plasma system including an RF source 207 electrically coupled with showerhead 205. For example, electrode 235 may operate as a ground path for RF power from the RF source 207, while also operating as an electric bias to the substrate to provide electrostatic clamping of the substrate to the substrate platform 227. Power source 240 may include a filter, a power supply, and a number of other electrical components configured to provide a chucking voltage.

In operation, a substrate may be in at least partial contact with the substrate platform 227 of the electrostatic chuck body. This may produce a contact gap, which may essentially produce a capacitive effect between a surface of the pedestal and the substrate. Voltage may be applied to the contact gap, which may generate an electrostatic force for chucking. The power supply 240 may provide electric charge that migrates from the electrode to the substrate support surface 229 where it may accumulate, and which may produce a charge layer having Coulomb attraction with opposite charges at the substrate, and which may electrostatically hold the substrate against the substrate platform 227 of the chuck body 225. This charge migration may occur by current flowing through a dielectric material of the chuck body 225 based on a finite resistance within the dielectric for Johnsen-Rahbek type chucking, which may be used in some embodiments of the present technology.

In some embodiments the electrostatic chuck body 225 and/or the stem 230 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 225 may also include an embedded heater 250 contained within the chuck body 225. Heater 250 may include a resistive heater or a fluid heater in embodiments. In some embodiments the electrode 235 may be operated as the heater, but by decoupling these operations, more individual control may be afforded, and extended heater coverage may be provided while limiting the region for plasma formation. Heater 250 may include a polymer heater bonded or coupled with the chuck body material, although a conductive element may be embedded within the electrostatic chuck body and configured to receive current, such as AC current, to heat the top puck. The current may be delivered through the stem 230 through a similar channel as the DC power discussed above. Heater 250 may be coupled with a power supply 285, which may provide current to a resistive heating element to facilitate heating of the associated chuck body 225 and/or substrate. Heater 250 may include multiple heaters in embodiments, and each heater may be associated with a zone of the chuck body, and thus exemplary chuck bodies may include a similar number or greater number of zones than heaters. The chucking mesh electrode 235 may be positioned between the heater 250 and the substrate platform 227 in some embodiments, and a distance may be maintained between the electrode within the chuck body 225 and the substrate platform 227 in some embodiments as will be described further below.

The substrate support surface 229 may define a number of protrusions 231, which may extend upward from the substrate support surface 229. Each protrusion 231 may have a generally flat top surface for supporting a bottom surface of a substrate. The protrusions 231 may be characterized by any number of geometries and profiles in embodiments of the present technology. In some embodiments, the protrusions 231 may have circular cross-sections. For example, protrusions 231 may have a generally cylindrical and/or conical frustum shape. It will be appreciated that other shapes of protrusions may be used in various embodiments. The density of the protrusions 231 may be constant and/or vary across the substrate support surface 229. For example, the density of the plurality of protrusions may be greater near a peripheral edge of the substrate support surface 229 than near a center of the substrate support surface 229.

Each protrusion 231 may be characterized by a diameter or width between about 0.5 mm and 3 mm. For example, each protrusion 231 may have a diameter or width of greater than or about 0.5 mm, greater than or about 1 mm, greater than or about 1.5 mm, greater than or about 2 mm, or more. Substrate support surface 229 may, in some embodiments, include a combination of protrusions 231 of various diameters between about 0.5 mm and 3 mm.

Oftentimes, upper corners of each protrusion 231 may be rounded, which may reduce or limit the sharp contact between the edge of protrusions 231 and the substrate. By providing a rounded corner on protrusions 231, an edge interaction with the substrate may be reduced when a substrate begins deflecting, which may reduce or limit scratching on the backside of the substrate. The amount of rounding may vary depending on any number of characteristics of the protrusions 231 or substrate support, although in some embodiments the corner radius may be less than or about 30% of a height of the protrusion 231, and may be less than or about 25% of the height, less than or about 20% of the height, less than or about 18% of the height, less than or about 15% of the height, less than or about 14% of the height, less than or about 13% of the height, less than or about 12% of the height, less than or about 11% of the height, less than or about 10% of the height, less than or about 9% of the height, or less, although in some embodiments the corner radius may be greater than or about 5% to ensure a reduced edge of the protrusions 231 are contacting the substrate.

For example, for a 30 µm tall protrusions 231, the corner radius may be less than or about 10 µm, and may be less than or about 9 µm, less than or about 8 µm, less than or about 7 µm, less than or about 6 µm, less than or about 5 µm, less than or about 4 µm, less than or about 3 µm, less than or about 2 µm, or less, although in some embodiments the corner radius may be greater than or about 3 µm to ensure sufficient rounding to limit edge contact. It is to be understood that protrusions 231 encompassed by embodiments of the present technology may be characterized by any other height or diameter as discussed previously. By providing substrate support assemblies characterized by protrusions 231 characterized by a rounded edge profile, the present technology may afford reduced backside damage on processed substrates, which may limit fall-on particles and lithography defocus, as well as improve device yield.

As best seen in FIG. 2B, the substrate support surface 229 may define one or more regions that are depressed and/or raised relative to a primary region 265 of the substrate support surface 229. For example, the depressed region 270 may be in the form of an annular groove may be defined within a portion of the substrate support surface 229. A cross-section of the depressed region 270 may be constant and/or vary along a length of the depressed region 270.

The depressed region 270 may have any cross-sectional shape. For example, in some embodiments, the depressed region 270 may have a rectangular cross-sectional shape such that a depth is constant across a width of the depressed region 270. In other embodiments, the cross-section of the depressed region 270 may be tapered and/or contoured such that the depth of the depressed region 270 varies across the width of the depressed region 270. A subset of the protrusions 231a may be disposed within the depressed region 270, with a top surface of the protrusions 231a within the subset being substantially planar (e.g., within or about 5 µm or less) with the top surfaces of protrusions 231 that are not included in the subset. As a result, the protrusions 231a within the subset may have a greater height than the remaining protrusions 231 due to a lower position of the base of each protrusion 231a within the subset.

By maintaining the top surfaces of the protrusions 231 at a constant vertical position while including one or more depressed regions 270, a size of a gap between the bottom surface of the substrate and a top surface of the substrate support surface 229 (which may be represented by a height of each protrusion 231) may be varied across the substrate, which may result in different deposition rate across the surface of the substrate. For example, the larger gaps between the bottom surface of the substrate and the top surface of the substrate support surface 229 may enable a greater amount of gas (such as air and/or a purge gas such as argon) to be trapped below the substrate during deposition operations. This larger gap (and the gas therein) may enable the substrate support surface 229 proximate the gap to more effectively absorb and dissipate heat generated by the plasma, which may result in the portion of the substrate proximate the larger gap being at a slightly lower temperature than the portion of the substrate that is disposed above the primary region 265 (which has a higher top surface). This lower temperature may decrease a deposition rate at locations of the substrate that are positioned above the depressed regions 270. In some embodiments, the thermal effects of the depressed region 270 may be exhibited both at areas of the substrate directly above the depressed region 270 and/or at areas proximate the depressed region 270. For example, the thermal effects (e.g., reduced temperature) may be exhibited at areas of the substrate that are within or about 30 mm, within or about 25 mm, within or about 20 mm, within or about 15 mm, within or about 10 mm, within or about 5 mm, or less from the edges of the depressed region 270. This thermal shift may occur inward and/or outward of the depressed region 270, with the thermal effect being the same or different in the two directions.

The depressed regions 270 may be positioned below known areas of high film thickness. Oftentimes, areas of high film thickness may be outer regions that are just inward of the peripheral edge of the substrate. For example, the high film thickness area may be within an outer 70% to 90% of the substrate in some embodiments (although other embodiments may see high film thickness at other areas, such as near the center and/or at peripheral edge regions of the substrate). In some embodiments, the depressed regions 270 may be positioned within an outer 50% of a radius of the substrate support surface, within an outer 40% of a radius of the substrate support surface, within an outer 30% of a radius of the substrate support surface, within an outer 20% of a radius of the substrate support surface, within an outer 10% of a radius of the substrate support surface, or further radially outward, although any area of the substrate support surface 229 (e.g., areas within or about an inner 50% of the radius of the substrate support, within or about an inner 40% of the radius of the substrate support, within or about an inner 30% of the radius of the substrate support, within or about an inner 20% of the radius of the substrate support, within or about an inner 10% of the radius of the substrate support, or less) may include depressed regions in various embodiments.

A depth of each depressed region 270 may correspond to a given change in temperature at the substrate which may itself correspond to a given change in film thickness on the substrate at the position of the depressed region. As just one example, a depth change of 0.8 mils (or other distance) in a given direction may result in a temperature range of between about 2.1° C. and 2.3° C. (or other temperature range). A temperature modulation of 1° C. may correspond a film thickness correction of approximately 500 Å (or other thickness) on the portion of the substrate positioned above the depressed region 270. For example, if the protrusions 231 within the primary region 250 of the substrate support surface have heights of 1.2 mils and the protrusions 231a within the subset that are disposed within the depressed region 270 have heights of 2.4 mils (corresponding with a depressed region depth of 1.2 mils), the portion of the substrate positioned above the depressed region 270 may result in a reduction of film thickness of between or about 1500 Å and 1800 Å. Based on the relationship between the depth of the depressed region 270 and the temperature/film thickness, the size, position, and/or shape of each depressed may be selected to alter a film thickness profile of a substrate. For example, one or more depressed regions 270 may be positioned on the substrate support surface 229 that corresponds to areas of high film thickness (possibly accounting for thermal shift as described above, which may result in the radial position of the depressed region being shifted by as much as 30 mm). The depth of each depressed region 270 may be less than or about 3 mils, less than or about 2 mils, less than or about 1.5 mils, less than or about 1 mil, less than or about 0.5 mils, or less. Each protrusion in the primary region 265 may have a height of between or about 0.2 mils and 4 mils, between or about 0.4 mils and 3.5 mils, between or about 0.6 mils and 3.0 mils, between or about 0.8 mils and 2.5 mils, between or about 1.0 mils and 2.0 mils, between or about 1.2 mils and 1.8 mils, or between or about 1.4 mils and 1.6 mils. Each protrusion 231a within the subset within the depressed region 270 may have a height of between or about 0.3 mils and 7 mils, between or about 0.4 mils and 6.5 mils, between or about 0.5 mils and 6.0 mils, between or about 0.6 mils and 5.5 mils, between or about 0.7 mils and 5.0 mils, between or about 0.8 mils and 4.5 mils, between or about 0.9 mils and 4.0 mils, between or about 1.0 mils and 3.5 mils, between or about 1.2 mils and 3.0 mils, between or about 1.4 mils and 2.5 mils, or between or about 1.6 mils and 2.0 mils. In some embodiments, each protrusion 231a within the subset that is disposed within the depressed region 270 may have a height of at least 1.5 mils and each protrusion that are not disposed within the one or more regions may have a height of less than about 1.5 mils.

The height and/or depth of each depressed region 270 across the width of the depressed region 270 may be selected to correspond with a desired change in the film thickness within the given area of the substrate. Thus, the size and shape of each depressed region 270 may designed to reduce or eliminate a thick region of film in the thickness profile of a known film chemistry to effectively reduce the magnitude of the thick region and generate a more uniform film thickness across the surface of the substrate. If the thick region has a gradient of film thickness, the depth of the depressed region 270 may be contoured to generally correspond to the gradient reduce the gradient to a more level film thickness. A width of the groove or other depressed region 270 may correspond with a radius range on the substrate that exhibits the thicker film.

While shown with one depressed region, it will be appreciated that any number of depressed regions may be included on the substrate support surface. For example, FIG. 2C shows a substrate support surface 229c having a second depressed area 275 in the form of an additional annular groove, with the two annular grooves 270, 275 being spaced apart from one another. In other embodiments the two depressed regions 270, 275 may contact one another. In some embodiments with multiple depressed regions, each of the depressed regions may have a same depth, cross-sectional shape, and/or width, while in other embodiments the depth, cross-sectional shape, and/or width of one or more of the depressed regions may be different. For example, as illustrated here, the first depressed region 270 may be shallower and wider than the second depressed region 275 (although this may be reversed in various embodiments).

Annular shaped depressed regions may be useful to correct radial non-uniformity issues, however the invention is not limited to annular shapes. In some embodiments, depressed regions may include arc and/or wedge-shaped regions that do not extend about a full circumference of the substrate support surface. Such depressed regions may be used to correct asymmetric non-uniformity issues. Depressed regions may have any size or shape (such as circular, elliptical, rectangular, etc.) and may be positioned on any area of the substrate support surface to correct any size and/or shape of non-uniformity issue.

While discussed primarily in the context of depressed regions, some embodiments may include one or more elevated regions that protrude above a top surface of the primary region of the substrate support surface while remaining lower than the top surfaces of the protrusions. The elevated regions may decrease the size of a gap between the bottom surface of the substrate and the substrate support surface (and resulting in shorter protrusions), which may increase the temperature of areas of the substrate that are positioned above the elevated regions. The elevated regions may be positioned anywhere on the top surface of the substrate support. In some embodiments, a substrate support may include both elevated regions and depressed regions. It will be appreciated that any combination of elevated and/or depressed regions may be utilized in various embodiments to combat film thickness non-uniformity issues.

Figure 3:
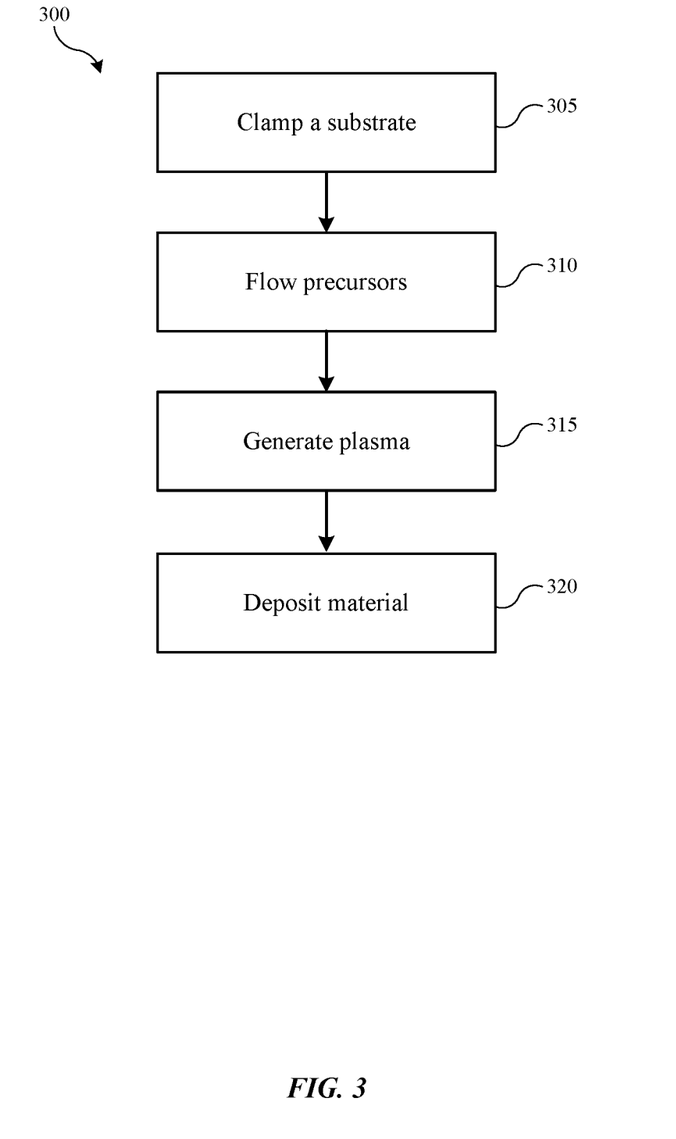
FIG. 3 shows operations of an exemplary method of semiconductor processing according to some embodiments of the present technology.

FIG. 3 shows operations of an exemplary method 300 of semiconductor processing according to some embodiments of the present technology. The method 300 may be performed in a variety of processing chambers, including processing system 100 and/or chamber 200 described above, which may include substrate platforms according to embodiments of the present technology, such as substrate platform 227. Method 300 may include a number of optional operations, which may or may not be specifically associated with some embodiments of methods according to the present technology.

Method 300 may include a processing method that may include operations for forming a hardmask film or other deposition operations. The method may include optional operations prior to initiation of method 300, or the method may include additional operations. For example, method 300 may include operations performed in different orders than illustrated. In some embodiments, method 300 may include clamping a semiconductor substrate to a substrate support surface of a substrate platform using a chucking force at operation 305. The chucking force may be a vacuum chucking force and/or an electrostatic chucking force. For example, a semiconductor substrate may be positioned atop a number of protrusions that extend upward from the substrate support surface. The substrate may be in at least partial contact with the substrate platform via the protrusions, which may produce a contact gap. Voltage may be applied to the contact gap, which may generate an electrostatic force for chucking.

The substrate support surface may include one or more depressed regions that extend deeper into a body of the substrate support than a primary region of the substrate support surface. For example, the depressed regions may be in the form of one of more annular grooves. The depressed regions increase a size of a gap between the bottom surface of the substrate and the substrate support surface. Gases within this larger gap may thermally isolate the substrate support surface from the substrate such that the substrate support may better absorb and dissipate heat generated by the plasma formation. This may enable the portion of the substrate that is positioned above the gap to enable to be at a slightly lower temperature than the portion of the substrate that is disposed above the primary region of the substrate support surface (which has a higher top surface). This lower temperature may decrease a deposition rate at locations of the substrate that are positioned proximate the depressed regions.

In some embodiments, method 300 may include flowing one or more precursors into a processing chamber at operation 310. For example, the precursor may be flowed into a chamber, such as chamber 200, and may flow the precursor through one or more of a gasbox, a blocker plate, or a showerhead, prior to delivering the precursor into a processing region of the chamber. At operation 315, a plasma may be generated of the precursors within the processing region, such as by providing RF power to the showerhead to generate a plasma. Material formed in the plasma may be deposited on the substrate at operation 320. In some embodiments, the deposited material may be characterized by a thickness at the edge of the substrate that approximately the same as a thickness within a central region of the substrate. For example, the material deposited is characterized by a thickness proximate an edge of the substrate has a target uniformity of less than 1500 Å.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:
a chuck body defining a substrate support surface, wherein:
  the substrate support surface defines a plurality of protrusions that extend upward from the substrate support surface;
  the substrate support surface defines first annular groove and a second annular groove;
  the first annular groove and the second annular groove are radially spaced apart from one another;
  a first subset of the plurality of protrusions are disposed within the first annular groove; and
  a second subset of the plurality of protrusions are disposed within the second annular groove; and
a support stem coupled with the chuck body.

2. The substrate support assembly of claim 1, wherein:
each protrusion within the first subset and the second subset has a greater height than each of the plurality of protrusions that are not disposed within the first annular groove or the second annular groove.

3. The substrate support assembly of claim 1, wherein:
a top surface of each of the plurality of protrusions is at a substantially same vertical position.

4. The substrate support assembly of claim 1, wherein:
the first annular groove is disposed within an outer 50% of a radius of the substrate support surface.

5. The substrate support assembly of claim 1, wherein:
a depth of the first annular groove is constant across a width of the first annular groove.

6. The substrate support assembly of claim 1, wherein:
a depth of the annular groove varies across a width of the annular groove.

7. A substrate support assembly, comprising:
a chuck body defining a substrate support surface, wherein:
  the substrate support surface defines a plurality of protrusions that extend upward from the substrate support surface;
  the substrate support surface defines a first region and a second region that are depressed relative to a primary region of the substrate support surface;
  the first region and the second region are spaced apart from one another about the substrate support surface;

a subset of the plurality of protrusions are disposed within each of the first region and the second region; and a support stem coupled with the chuck body.

8. The substrate support assembly of claim 7, wherein: each protrusion within the subset has a height of at least 1.5 mils and at least some of the plurality of protrusions that are not disposed within the first region or the second region have a height of less than about 1.5 mils.

9. The substrate support assembly of claim 7, wherein: the first region has a different depth than the second region.

10. The substrate support assembly of claim 7, wherein: a top surface of each of the plurality of protrusions is at a substantially same vertical position; and a distance between the substrate support surface and the top surface of each of the plurality of protrusions varies across a width of the substrate support surface.

11. The substrate support assembly of claim 7, wherein: a density of the plurality of protrusions is greater near a peripheral edge of the substrate support surface than near a center of the substrate support surface.

12. The substrate support assembly of claim 7, wherein: the chuck body comprises an electrostatic chuck or a vacuum chuck.

13. The substrate support assembly of claim 7, wherein: at least one of the first region and the second region comprises an annular groove.

14. The substrate support assembly of claim 7, wherein: at least one of the first region and the second region extends only partially about a circumference of the substrate support surface.

15. A method of processing a substrate, comprising: clamping a substrate to a substrate support surface of a chuck body using a chucking force, wherein:
the substrate support surface defines a plurality of protrusions that extend upward from the substrate support surface;
the substrate support surface defines a first region and a second region that are depressed relative to a primary region of the substrate support surface; and
the first region and the second region are spaced apart from one another about the substrate support surface;
a subset of the plurality of protrusions are disposed within each of the first region and the second region;
flowing a precursor into a processing chamber;
generating a plasma of the precursor within a processing region of the processing chamber; and
depositing a material on the substrate.

16. The method of processing a substrate of claim 15, wherein:
the chucking force comprises an electrostatic chucking force.

17. The method of processing a substrate of claim 15, wherein:
at least one of the first region and the second region comprises an annular groove.

* * * * *